(12) United States Patent
Onoue et al.

(10) Patent No.: US 6,428,732 B1
(45) Date of Patent: Aug. 6, 2002

(54) INSERT-MOLDING METHOD FOR OBTAINING A RESIN-MOLDED PRODUCT

(75) Inventors: Tsutomu Onoue; Takehiro Sengoku, both of Kariya; Hisashi Kayano, Toyoake, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/328,338

(22) Filed: Jun. 9, 1999

(30) Foreign Application Priority Data

Jun. 9, 1998 (JP) .......................................... 10-160425

(51) Int. Cl.⁷ .......................... B29C 45/14; B29C 33/12
(52) U.S. Cl. ........................................ 264/278; 264/275
(58) Field of Search .................................. 264/275, 278, 264/271.1, 328.7, 328.8, 279, 279.1; 425/116, 121, 125, 577

(56) References Cited

U.S. PATENT DOCUMENTS

| | | | | |
|---|---|---|---|---|
| 4,377,548 A | * | 3/1983 | Pierpont | 264/265 |
| 4,470,786 A | * | 9/1984 | Sano et al. | 425/125 |
| 4,803,030 A | * | 2/1989 | Kobayashi | 264/278 |
| 5,053,181 A | * | 10/1991 | Ohasi et al. | 264/296 |
| 5,372,767 A | * | 12/1994 | Zimmermann et al. | 264/154 |
| 5,458,842 A | * | 10/1995 | Goto | 264/296 |
| 5,639,403 A | * | 6/1997 | Ida et al. | 264/278 |
| 5,879,599 A | * | 3/1999 | Inoue et al. | 264/278 |
| 6,063,321 A | * | 5/2000 | Koyama et al. | 264/404 |

FOREIGN PATENT DOCUMENTS

| | | |
|---|---|---|
| JP | 55-91642 | 7/1980 |
| JP | 57-163528 | 10/1982 |
| JP | 8-306718 | 11/1996 |
| JP | 9-38982 | 2/1997 |

\* cited by examiner

*Primary Examiner*—Angela Ortiz
(74) *Attorney, Agent, or Firm*—Harness, Dickey & Pierce, PLC

(57) ABSTRACT

A method of producing an insert-molding product in which an insert product is covered with a synthetic resin by arranging the insert product in a cavity of a mold is provided. The method includes holding the insert product by a holding pin, pouring a molten synthetic resin into the cavity, and retracting the holding pin. At least one moving pin is provided adjacent the holding pin. After the cavity is filled with the synthetic resin, the holding pin is retracted and the at least one moving pin is moved to extrude and introduce the synthetic resin into a space where the holding pin used to be positioned prior to its retraction from the cavity.

10 Claims, 9 Drawing Sheets

INSERT-MOLDING METHOD FOR OBTAINING A RESIN-MOLDED PRODUCT

BACKGROUND OF THE INVENTION

1. Field of the Invention

The present invention relates to an insert-molding method for obtaining resin-molded products in which insert products such as electronic parts are sealed with a resin to a sufficient degree without deviation in position, and to a molding device therefor.

2. Description of the Related Art

In order to maintain the water-proof properties of electronic parts, there have heretofore been employed a method by which the surfaces of the electronic parts are covered with a potting material, a method by which a resin sealing plug is attached thereto, and the like method.

In recent years, however, there has been widely employed a method by which the surfaces are sealed with a resin in order to decrease the cost of products and to enhance the ratio of recycling. The sealing with the resin is generally based on an insert-molding method which features excellent mass-productivity at a decreased cost.

As the device used for the insert molding, there has heretofore been known the one disclosed in, for example, Japanese Unexamined Patent Publication (Kokai) No. 55-91642. That is, as shown in FIG. 10, there has been proposed a molding device 9 comprising a mold 90 having a cavity 91 in which will be arranged an insert product 2, and a holding pin 92 retractably provided in the mold 90 to hold the insert product 2 at a tip 921. Reference numeral 95 denotes a port for pouring-in the synthetic resin.

Described below is an insert-molding method using the above-mentioned mold 9.

First, the insert product 2 is arranged at a predetermined position in the cavity 91 being held by the holding pin 92. Next, the cavity 91 is filled with a synthetic resin 3 and, then, the holding pin 92 is retracted from the cavity 91. Thereafter, the cavity is further filled with the synthetic resin 3.

Thus, there is obtained a resin-molded product in which the whole surface of the insertion product is sealed with the resin.

According to the above-mentioned insert-molding method and device, however, the quality of the molded product is affected by the timing of retracting the holding pin 92 from the cavity 91. That is, when the holding pin 92 is retracted before the cavity 91 is completely filled with the synthetic resin 3, there remains no melted portion caused by the holding pin 92, and the sealing with resin is accomplished to a sufficient degree. Due to the synthetic resin 3 that is filled, however, the insert product 2 moves and its position is deviated. When the holding pin 92 is retracted after the cavity 91 is completely filled with the synthetic resin 3, on the other hand, the space in which the holding pin 92 used to be positioned is not sufficiently filled with the synthetic resin 3, and the insert product 2 is not sealed with the resin to a sufficient degree.

There has further been proposed a method according to which the synthetic resin 3 is forcibly extruded and introduced into space where the holding pin used to be positioned as disclosed in Japanese Unexamined Patent Publication (Kokai) No. 57-163528 or Japanese Unexamined Patent Publication (Kokai) No. 8-306718.

That is, as shown in FIG. 11, a device 8 used for this method includes a mold 80 having a cavity 81, a cylindrical holding pin 82 retractably provided in the mold 80, and a pole-like moving pin 83 retractably provided in the holding pin 82.

Briefly described below is the insert-molding method by using the above-mentioned molding device 8.

That is, referring to FIG. 11, an insert product 20 is arranged in the cavity 81 and is held by the holding pin 82. The cavity 81 is then filled with the synthetic resin 3.

Then, as shown in FIG. 12, the moving pin 83 is moved in the direction of the cavity 81 while the holding pin 82 is retracted, and the synthetic resin 3 is forcibly extruded and introduced into space where the holding pin 82 used to be positioned.

The insert product 20 has a through hole 201 formed in the central portion thereof and an accessory 202 such as a reed frame on the end surfaces thereof, the accessory 202 extending beyond the cavity 81 so as to be held by the mold 80.

However, the above-mentioned conventional insert-molding method and device have problems as described below.

That is, after the synthetic resin 3 is introduced, the surface of the synthetic resin 3 contacting to the holding pin 82 is cooled by the holding pin 82, resulting in the formation of a skin layer (solidified layer on the surface of the resin) 31.

The holding pin 82 has a cylindrical shape and, hence, the skin layer 31 assumes a cylindrical shape, too, as shown in FIG. 13.

Therefore, the area of the skin layer 31 inevitably increases but is never concentrated to one point despite being extruded by the moving pin 83.

Accordingly, the skin layer 31 does not melt again despite of the ambient heat or pressure, and the unmelted portion is very likely to remain.

When the holding pin 82 is retracted at a delayed timing, therefore, the unmelted portion remains and the insert product 20 is not sealed with the resin to a sufficient degree.

SUMMARY OF THE INVENTION

The present invention was accomplished in view of the above-mentioned problem inherent in the prior art, and its object is to provide an insert-molding method capable of sealing an insert product with a resin to a sufficient degree without permitting the position of the insert product to be deviated as a result of suppressing the residence of the unmelted portion caused by the holding pin, and a molding device therefor.

A first aspect of the present invention is concerned with an insert-molding method in which an insert product is arranged in a cavity of a mold and is held by a holding pin, a molten synthetic resin is poured into said cavity, and said holding pin is retracted to obtain an insert-molding product in which said insert product is covered with said synthetic resin, wherein a moving pin is provided adjacent to said holding pin, said moving pin is moved in the direction of the cavity while retracting said holding pin after said cavity is filled with said synthetic resin, and said synthetic resin is extruded and introduced into space where said holding pin used to be positioned.

In the present invention, what most draws attention is that the moving pin is moved in the direction of the cavity while retracting the holding pin after the cavity is filled with the synthetic resin, and the synthetic resin is extruded and introduced into space where the holding pin used to be positioned.

A second aspect of the present invention is concerned with a molding device for carrying out the above-mentioned molding method to produce an insert-molding product in which an insert product is covered with a synthetic resin, comprising a mold having a cavity for molding, and a holding pin retractably provided in said mold to hold the insert product, wherein said mold has a moving pin that retractably moves in the direction of the cavity adjacent to said holding pin.

In this molding device, what most draws attention is that the moving pin retractably moves in the direction of the cavity adjacent to the holding pin.

Therefore, the molding device of the invention makes it possible to produce an insert-molding product in which the insert product is sealed with the resin to a sufficient degree while suppressing the deviation in position of the insert product.

The present invention may be more fully understood from the description of preferred embodiments of the invention set forth below together with the accompanying drawings.

DESCRIPTION OF THE PREFERRED EMBODIMENTS

The insert-molding method and device according to an embodiment 1 of the present invention will now be described with reference to FIGS. 1 to 5.

Figure 1:
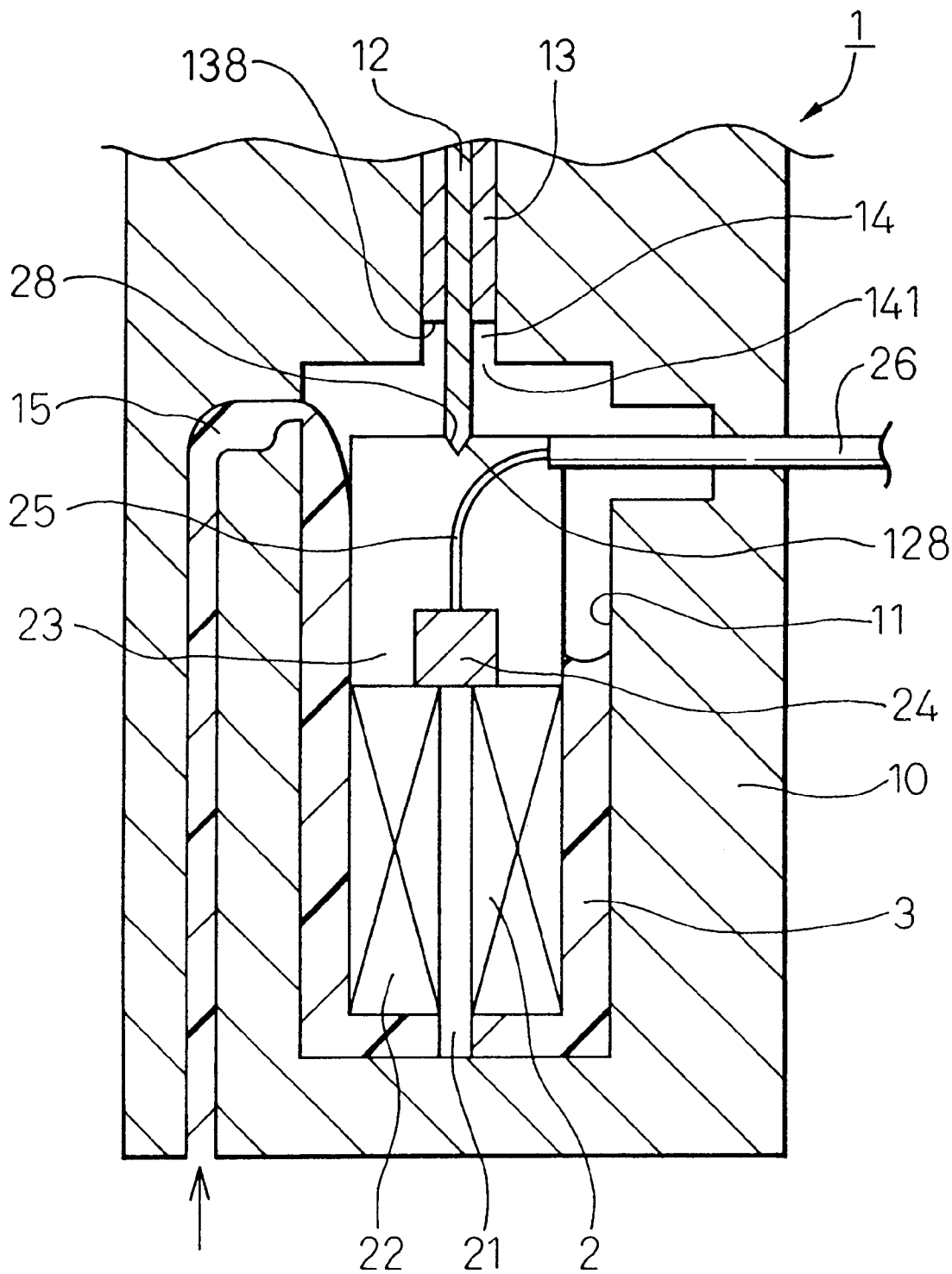
FIG. 1 is a sectional view of an insert-molding device according to an embodiment 1 of the present invention.

Referring to FIG. 1, an insert-molding device 1 of this embodiment possesses a mold 10 having a cavity 11 for molding, and a holding pin 12 retractably provided in the mold 10 to hold an insert product.

The insert-molding device 1 is the one for producing an insert-molding product 4 (FIG. 5) in which the insert product 2 is covered with a synthetic resin 3.

The mold 10 has a moving pin 13 that retractably moves in the direction of the cavity 11 adjacent to the holding pin 12.

The moving pin 13 is arranged to surround the holding pin 12 in concentric therewith.

The mold 10 has a guide hole 14 for guiding the moving pin 13 in the direction of the cavity 11.

In this embodiment, the holding pin 12 has a diameter of 3.0 mm.

In FIG. 1, furthermore, reference numeral 15 denotes a port for pouring the synthetic resin 3.

The insert product 2 is a speed sensor used for measuring the speed of an automobile or the like, and comprises a sensor terminal 21, a coil 22, a primary spool 23 and a magnet 24. The insert product 2 further has a lead wire 25 which, during the insert-molding, extends out of the mold 10 through a cable tube 26 that covers the lead wire 25.

A holding dent 28 with which an end of the holding pin 12 will come in contact is formed in the upper end of the insert product 2.

The molding method using the above-mentioned insert-molding device 1 will now be described.

Referring to FIG. 1, first, the insert product 2 is arranged in the cavity 11 of the mold 10, and the holding dent 28 at the upper end of the insert product 2 is held by an end 128 of the holding pin 12.

Then, the synthetic resin 3 in a melted state is poured into the cavity 11. At this moment, the end 138 of the moving pin 13 is positioned on the inside of an open end 141 of the guide hole 14.

Figure 2:
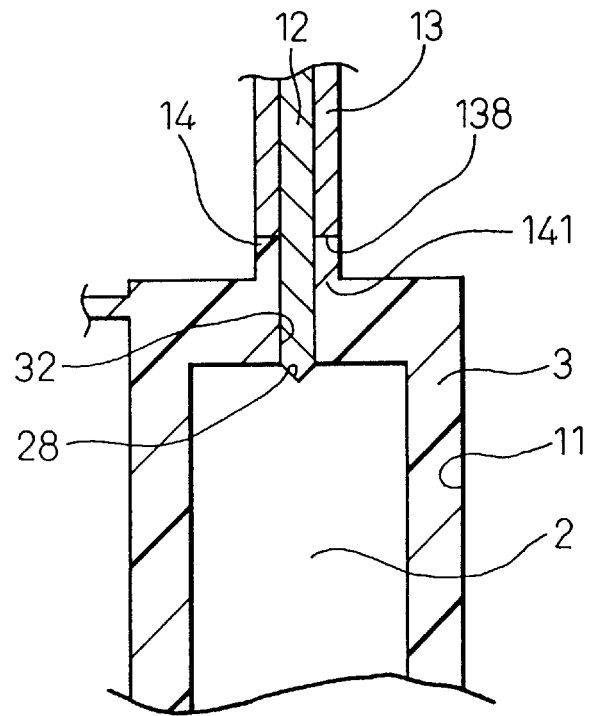
FIG. 2 is a view illustrating a state of just before a holding pin is retracted in an insert-molding method according to the embodiment 1 of the present invention.
Figure 3:
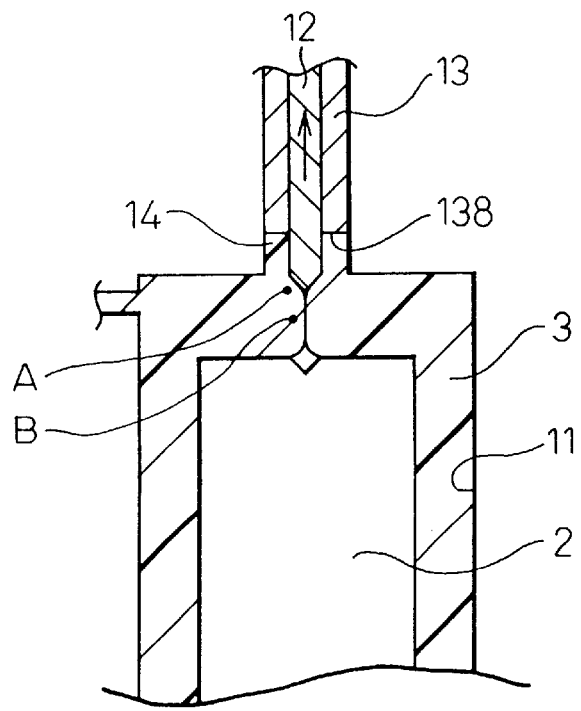
FIG. 3 is a view illustrating a state of just after the holding pin is retracted in the insert-molding method according to the embodiment 1 of the present invention.
Figure 4:
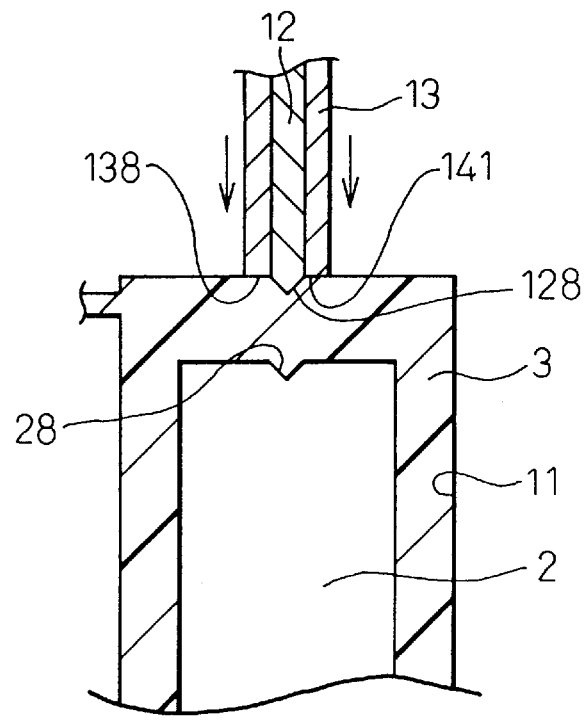
FIG. 4 is a view illustrating a state of after the moving pin is moved in the insert-molding method according to the embodiment 1 of the present invention.

Referring next to FIG. 2, the cavity 11 is filled with the synthetic resin 3 and, then, the holding pin 12 is retracted (FIG. 3) and, at the same time, the moving pin 13 is moved in the direction of the cavity 11 until the end 138 thereof is located at the same position as the open end 141 (FIG. 4). Therefore, the synthetic resin 3 filled in the guide hole 14 is extruded into the cavity 11.

Accordingly, the synthetic resin 3 is extruded and introduced into space 32 (see FIG. 2) in which the holding pin 12 used to be positioned.

Through the series of steps described above, there is produced an insert-molding product 4 (see FIG. 5) in which the insert product is covered with the synthetic resin 3.

Figure 5:
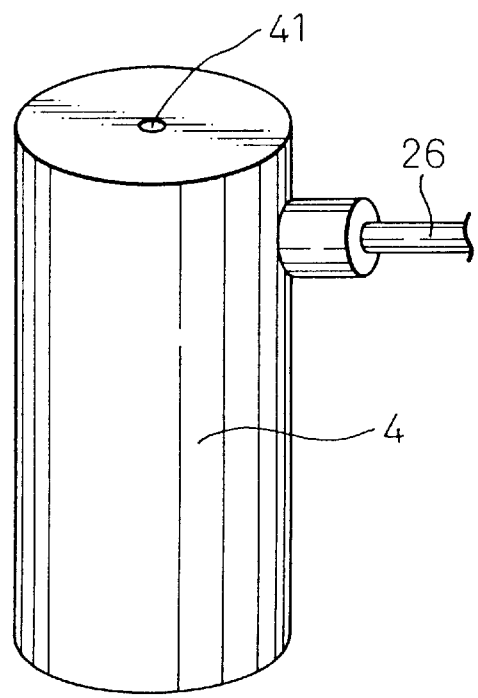
FIG. 5 is a perspective view of an insert-molding product obtained by the insert-molding method according to the embodiment 1 of the present invention.

In FIG. 5, reference numeral 41 denotes a mark of the holding pin formed like a dent by the end 128 of the holding pin 12.

Next, described below are the action and effect of this embodiment.

Referring to FIG. 2, when the holding pin 12 is retracted after the cavity 11 is filled with the synthetic resin 3, space is once formed in a portion where the holding pin 12 used to be positioned. The space 32 is then filled with the surrounding synthetic resin 3 but not to a sufficient degree (FIG. 3). Upon moving the moving pin 13 adjacent to the holding pin 12 as shown in FIG. 4, however, the synthetic resin 3 surrounding the space 32 is extruded and introduced into the space 32. Thus, the space disappears.

Furthermore, a skin layer (solidified layer on the surface of the resin) is formed on the surface of the synthetic resin 3 contacting the holding pin 12. Due to the pressure of the surrounding synthetic resin 3, however, the skin layer is concentrated to one point and melts again due to the pressure and heat of the synthetic resin 3.

In this embodiment, in particular, since only one holding pin 12 is used, the skin layer is not formed at all.

Accordingly, the insert product can be sealed with the resin to a sufficient degree.

The holding pin 12 is retracted after the synthetic resin 3 has been introduced and, hence, the position of the insert product 2 is very little deviated.

According to this embodiment, therefore, it is possible to produce the insert-molding product in which the insert product is sealed with the resin to a sufficient degree without causing the position of the insert product to be deviated.

In the present invention, it is desired that one holding pin 12 is employed. In this case, the unmelted portion can be completely extinguished.

It is further desired that the holding pin 12 has a diameter of from 1.0 mm to 6.0 mm. When the diameter is smaller than 1.0 mm, it becomes difficult to hold the insert-molding product. When the diameter exceeds 6.0 mm, on the other hand, it is likely that the unmelted portion is formed to some extent.

It is desired that the moving pin 13 is arranged to surround the holding pin 12 in concentric therewith.

In this case, the synthetic resin can be extruded and introduced into the space where the holding pin 12 used to be positioned from the whole circumference thereof and uniformly. Therefore, the synthetic resin can be efficiently and reliably extruded and introduced into the space.

It is therefore allowed to more reliably produce the insert-molding product in which the insert product is sealed with the resin.

Figure 6:
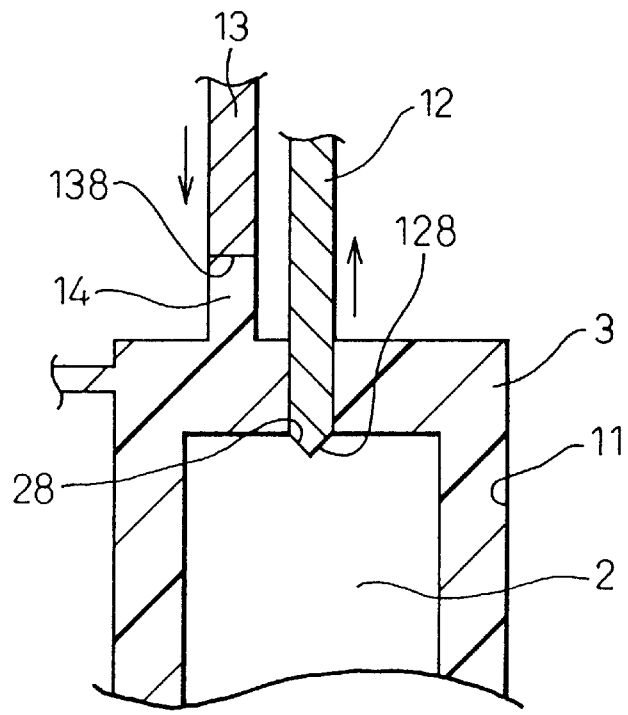
FIG. 6 is a sectional view of an insert-molding device according to an embodiment 2 of the present invention.

In embodiment 2, as shown in FIG. 6, the moving pin 13 is arranged separately from, and in parallel with, the holding pin 12.

In other respects, embodiment 2 is the same as embodiment 1.

In this case, the insert-molding device 1 can be constructed relatively simply. In other respects, embodiment 2 exhibits the same action and effect as embodiment 1.

Figure 7:
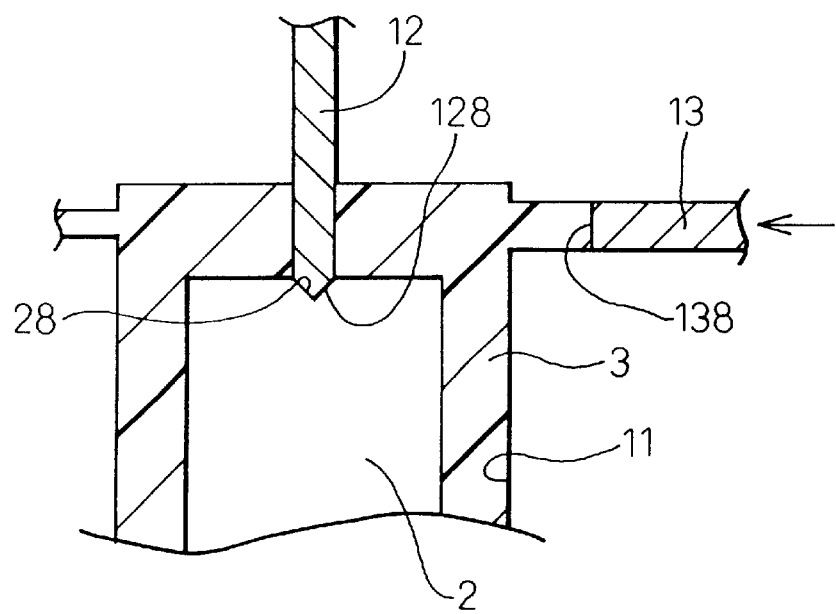
FIG. 7 is a sectional view of the insert-molding device according to an embodiment 3 of the present invention.

In embodiment 3, as shown in FIG. 7, the moving pin 13 is arranged at right angles with the holding pin 12. In other respects, embodiment 3 is the same as embodiment 1.

In this case, a plunger for moving the moving pin 13 back and forth, and a cylinder for moving the holding pin 12 back and forth, can be arranged at separate places unlike that of embodiment 1. Therefore, their arrangement is facilitated.

In other respects, the action and effect are the same as those of embodiment 1.

Figure 8:
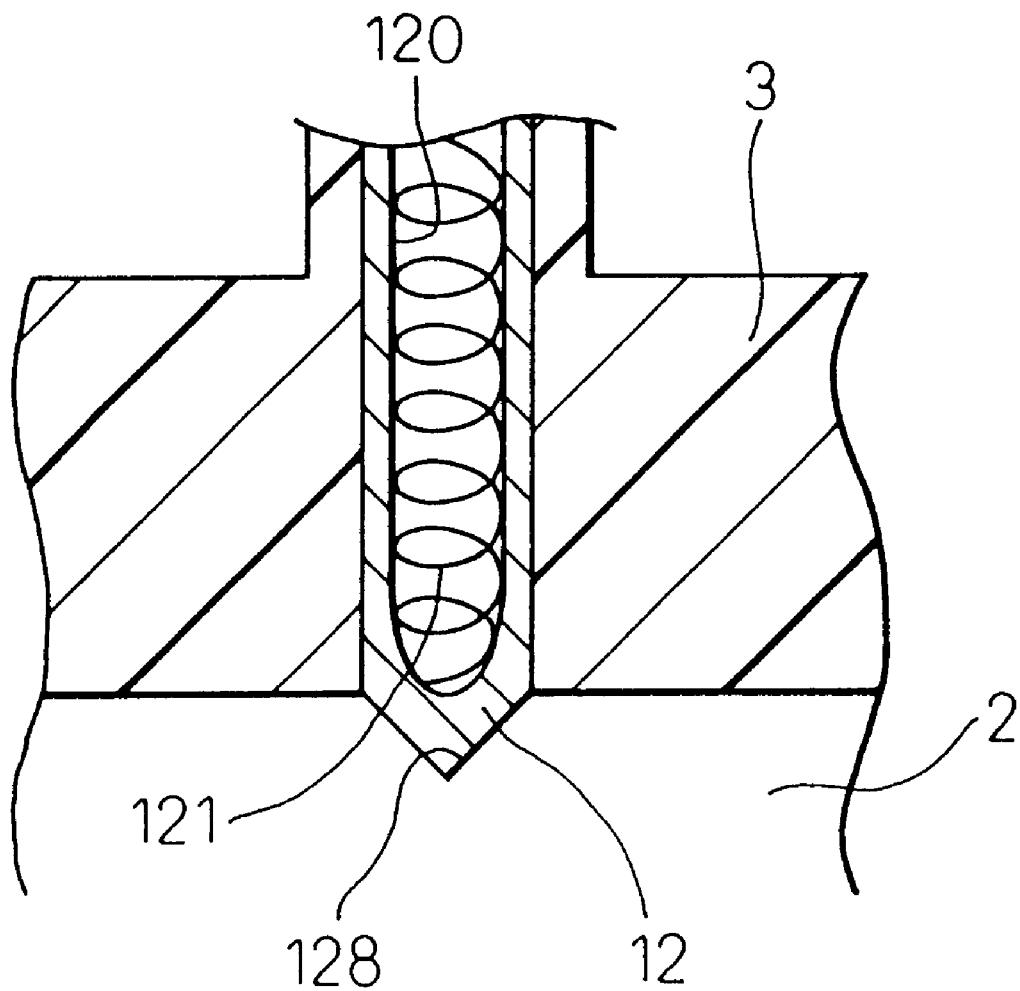
FIG. 8 is a sectional view illustrating the periphery of the holding pin in the insert-molding device according to an embodiment 4 of the present invention.

In embodiment 4, as shown in FIG. 8, a cylindrical recessed portion is formed in the holding pin 12, and a spiral heater 121 is contained therein.

In other respects, embodiment 4 is the same as embodiment 1.

When the cavity 11 is filled with the synthetic resin 3 in this case, no skin layer is formed on the surface of the synthetic resin 3 surrounding the holding pin 12 and contacting holding pin 12.

This is because the synthetic resin 3 surrounding the holding pin 12 is maintained at a high temperature owing to the heater 121 contained in the holding pin 12. Therefore, the synthetic resin 3 is not solidified.

Therefore, this embodiment makes it possible to produce an insert-molding product in which the insert product is sealed with the resin more reliably.

In the present invention, it is desired that the metal mold 10 has a guide hole 14 for guiding the moving pin 13 in the direction of the cavity, the end of the moving pin 13 is located on the inside of the open end of the guide hole 14 when the cavity is to be filled with the synthetic resin, the holding pin 12 is retracted after the cavity 11 is filled with the synthetic resin, and the moving pin 13 is moved in the direction of the cavity 11.

When the cavity 11 is filled with the synthetic resin in this case, the guide hole 14, too, is filled with the synthetic resin up to the end of the moving pin 13.

Therefore, the moving pin 13 is moved in the direction of the cavity while the holding pin 12 is being retracted, and the synthetic resin filled in the guide hole 14 is extruded into the cavity 11. Accordingly, the synthetic resin is extruded and introduced into the space where the holding pin 12 used to be positioned.

That is, according to the present invention, the synthetic resin to be introduced into the space in the guide hole 14 and can, hence, be extruded and introduced into the space to a sufficient degree.

It is therefore possible to produce the insert-molding product in which the insert product is sealed with the resin more reliably.

Figure 9:
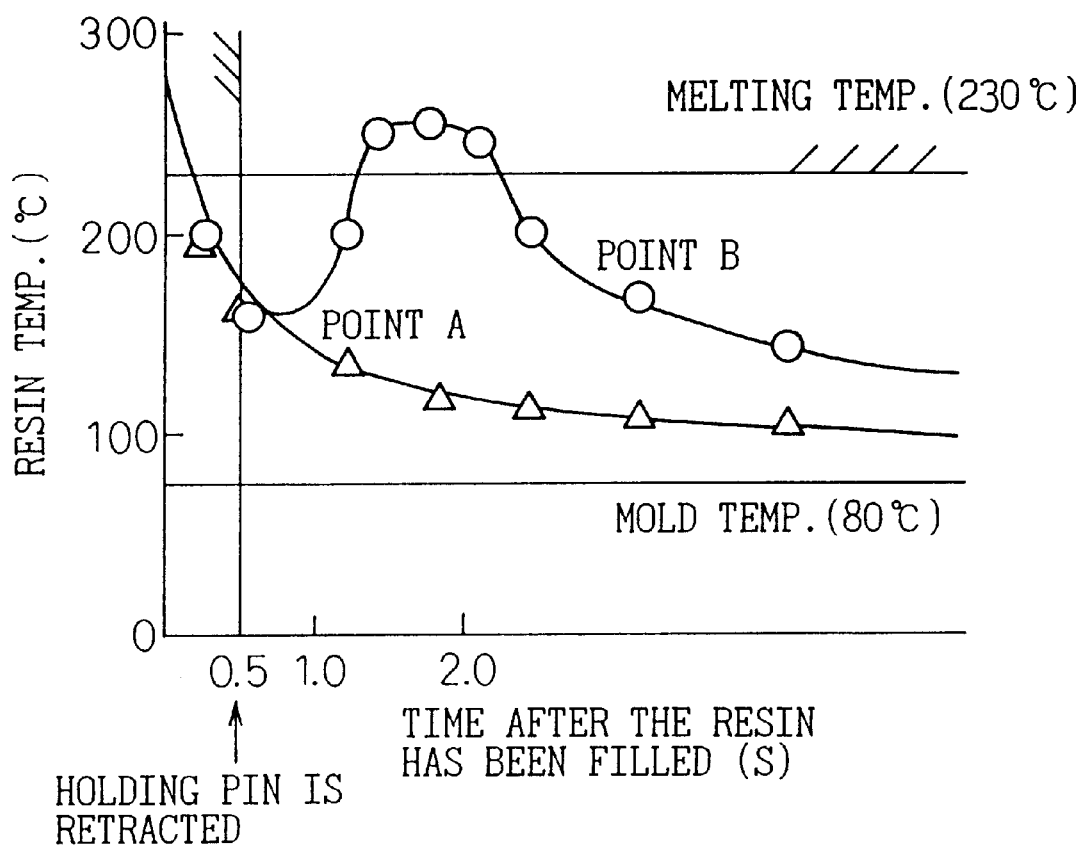
FIG. 9 is a diagram illustrating the measured results of changes in the temperature of the synthetic resin near the holding pin according to experiment of the present invention.
Figure 10:
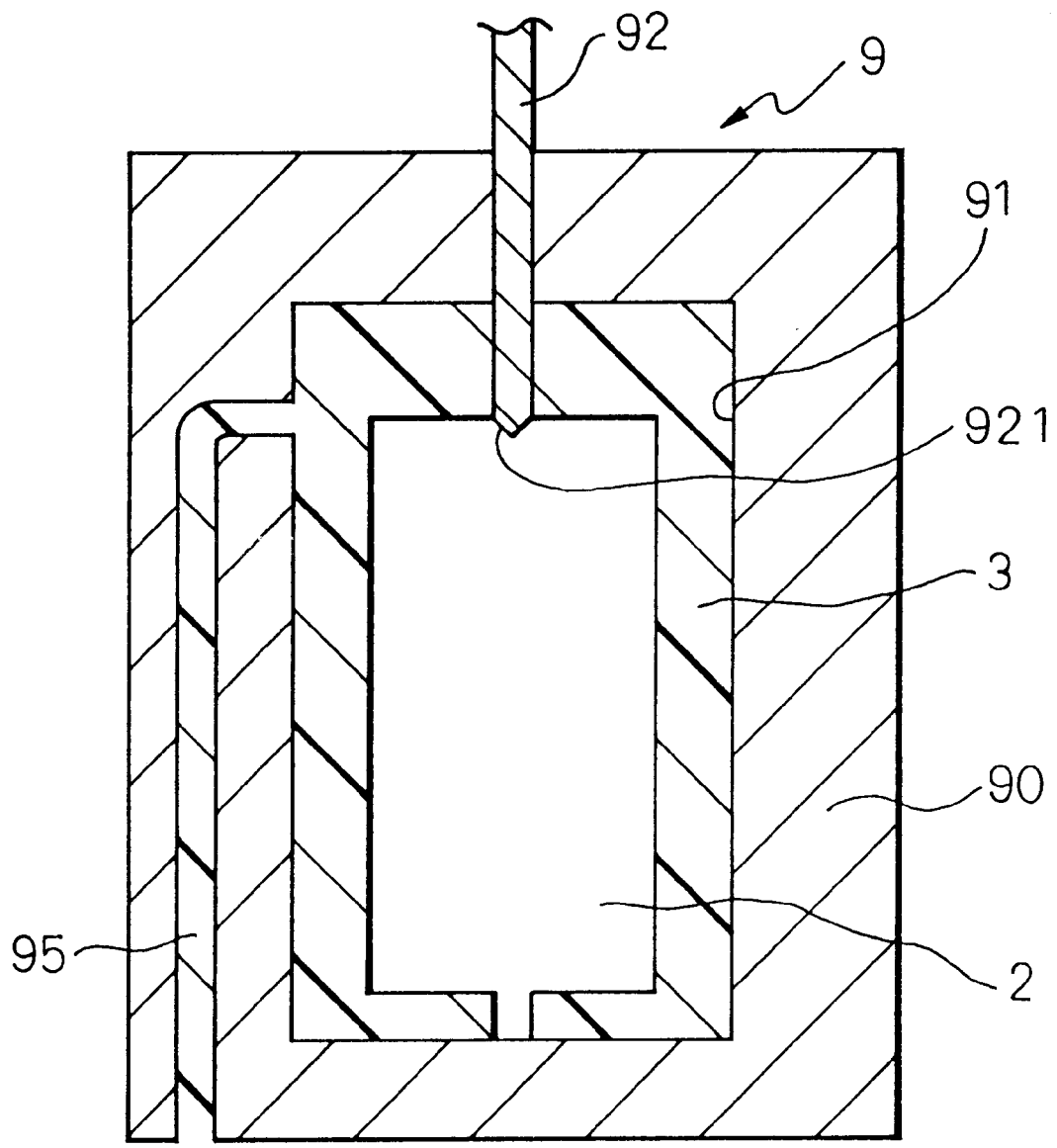
FIG. 10 is a sectional view of a conventional insert-molding device.
Figure 11:
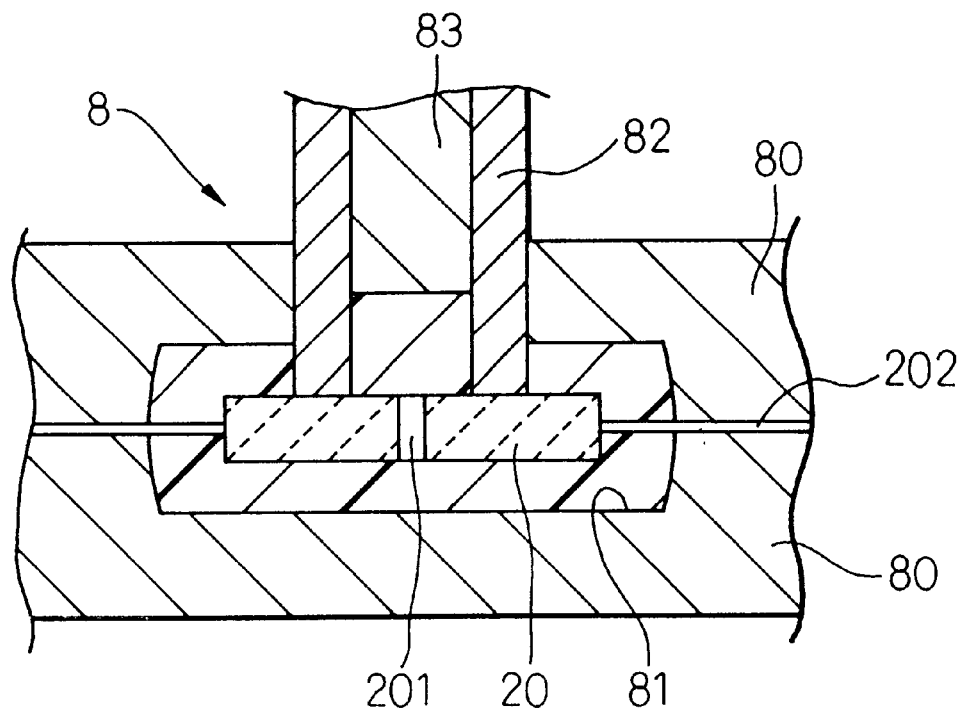
FIG. 11 is a sectional view of another conventional insert-molding device.
Figure 12:
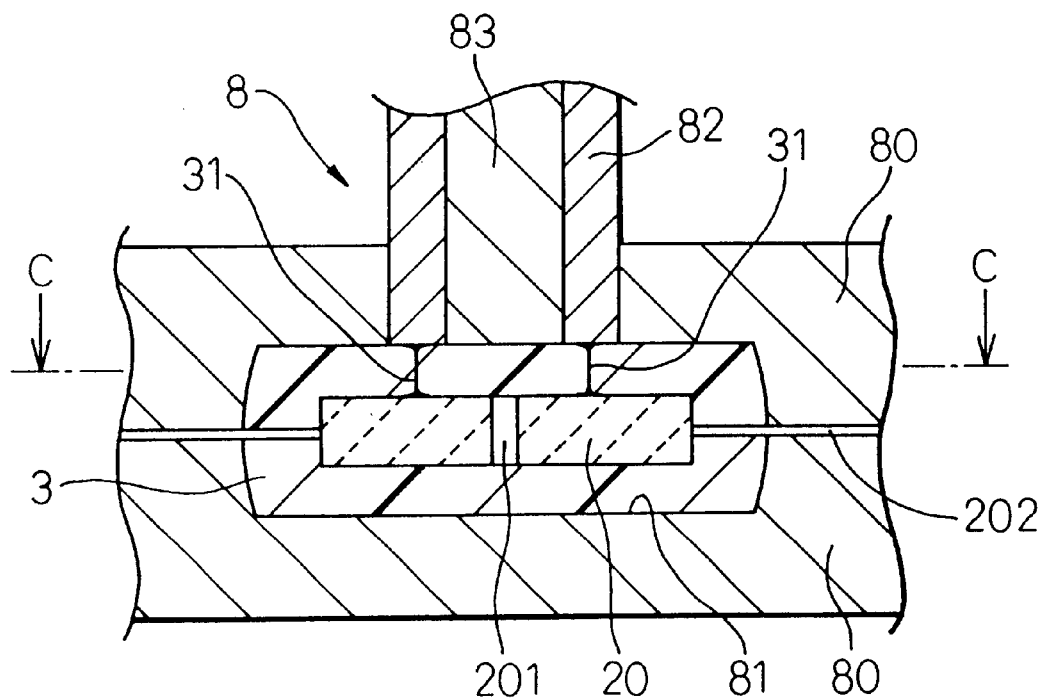
FIG. 12 is a sectional view illustrating a state of after the holding pin is retracted and the moving pin is moved in the another conventional insert-molding device.
Figure 13:
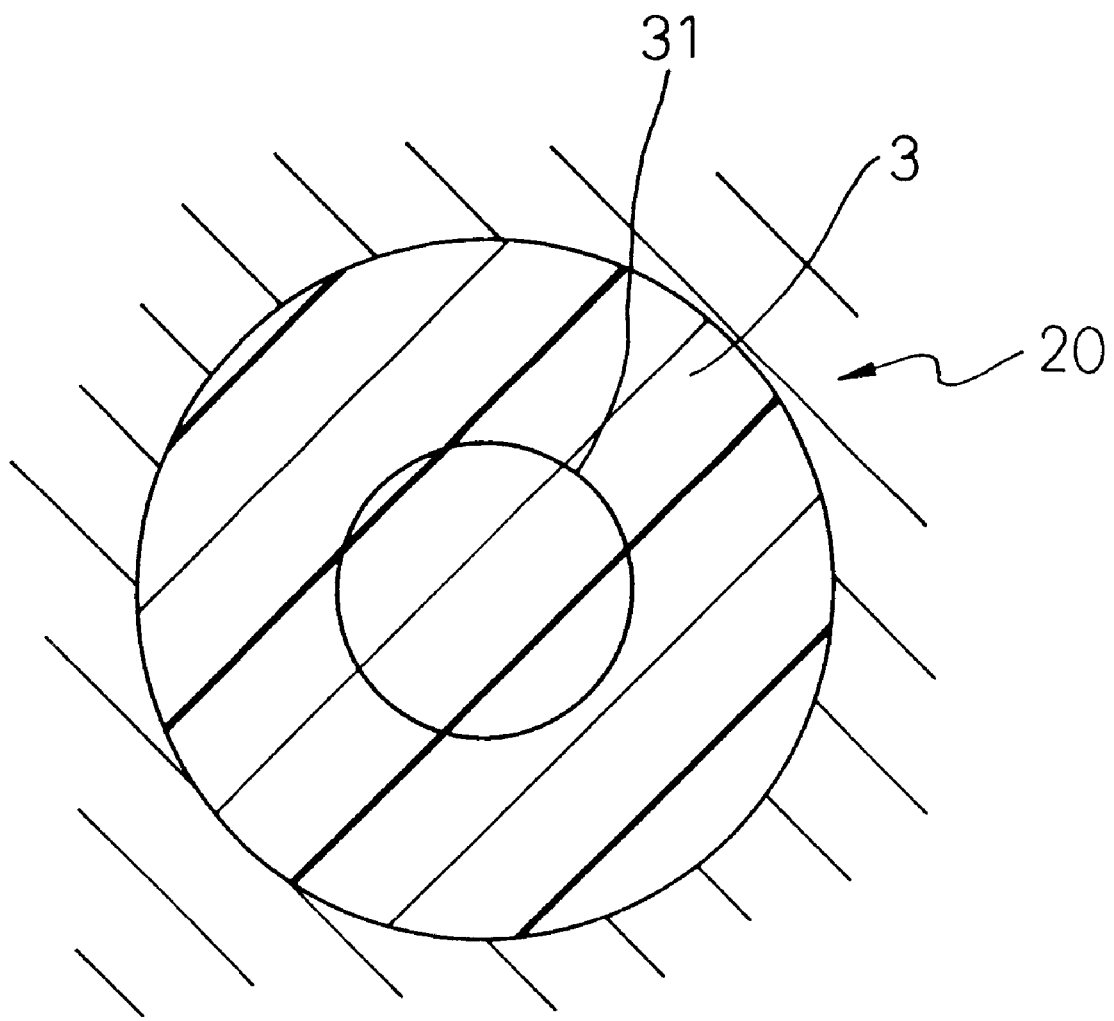
FIG. 13 is a sectional view along the line C—C in FIG. 12.

In an experimental example of the present invention as shown in FIG. 9, a change in the temperature of the synthetic resin near the holding pin 12 was measured when the holding pin 12 was retracted in conducting the insert-molding according to the present invention.

The measurement was taken while conducting the insert-molding shown in embodiment 1 by installing the temperature sensors at a point A and a point B shown in FIG. 3.

The point A is near the open end 141 of the guide hole 14 of the mold 10, and the point B is almost midway between the open end 141 and the holding dent 21 at the upper end of the insert product 2.

During the insert-molding, the measurement was started from a moment when the holding pin 12 was retracted. Thereafter, changes in the temperature of the synthetic resin 3 were monitored at the points A and B.

The results of measurement are as shown in FIG. 9.

As will be seen from FIG. 9, the temperature of the synthetic resin 3 at the point A sharply drops after the cavity 11 is filled with the synthetic resin, remains stable at about 100° C., and does not rise thereafter. At the point B, the temperature of the synthetic resin 3 once drops but rises again after the holding pin 12 is retracted. The temperature exceeds 230° C. which is the melting point of the synthetic resin for about one second from about 0.7 seconds after the retraction of the holding pin 12 until about 1.7 seconds after.

That is, during the above-mentioned period of one second, the skin layer melts and adheres again due to the pressure and heat of the surrounding synthetic resin 3.

It will thus be understood that the insert product 2 is sealed with the resin to a sufficient degree upon moving the moving pin 13 within about 1.7 seconds after the holding pin 12 is retracted.

While the invention has been described with reference to specific embodiments selected for purposes of explanation, it should be apparent that numerous modifications could be made thereto by those skilled in the art without departing from the basic concept and scope of the invention.

What is claimed is:

1. An insert-molding method in which an insert product is arranged in a cavity of a mold and held by at least one holding pin, said method comprising:

pouring a molten synthetic resin into said cavity;

retracting said holding pin from said cavity to obtain an insert-molding product, wherein said insert product is covered with said synthetic resin, and extruding the synthetic resin into the space where said holding pin was coated prior to retracting; wherein:

said holding pin is retracted from a space within said cavity after said cavity is filled with said synthetic resin, the synthetic resin is introduced into the space where said holding pin was located prior to said retracting, and said space is under pressure of the surrounding synthetic resin; and at least one moving pin is placed adjacent to said holding pin, and said moving pin is moved in the direction of the cavity to extrude and fill said synthetic resin into the space where said holding pin used to be located after the holding pin is retracted from said cavity and before said synthetic resin is cooled.

2. An insert-molding method according to claim 1, wherein said moving pin is arranged to surround said holding pin and to be concentric therewith.

3. An insert-molding method according to claim 1, wherein said moving pin is arranged parallel with said holding pin.

4. An insert-molding method according to claim 1, wherein moving pin is arranged at right angles with said holding pin.

5. An insert-molding method according to claim 1, wherein said holding pin contains a heater.

6. An insert-molding method according to claim 1, wherein said mold has a guide hole for guiding said moving pin in the direction of the cavity, an end of said moving pin is located on the inside of an open end of said guide hole when said cavity is being filled with said synthetic resin, and after said cavity is filled with said synthetic resin, said moving pin is moved in the direction of the cavity while retracting said holding pin.

7. An insert-molding method according to claim 1, wherein the synthetic resin is extruded and introduced into the space where said holding pin used to be located in a direction that is perpendicular to the direction of the holding pin to be retracted.

8. An insert molding method comprising:

arranging an insert product within a cavity of a mold;

holding said insert product within said cavity using a holding pin;

filling said cavity with a molten synthetic resin;

creating a space in said molten synthetic resin by retracting said holding pin from said cavity after completely filling said cavity;

increasing the temperature of said molten synthetic resin adjacent said space by extruding synthetic resin into said space.

9. An insert-molding method comprising:

arranging an insert product within a cavity of a mold;

holding said insert product within said cavity using a holding pin;

positioning a moving pin within a bore defined by said mold, said moving pin being movable between a retracted and an extended position, said bore defining a space in communication with said cavity when said moving pin is in said retracted position;

pouring a molten synthetic resin into said cavity and said space;

creating a hole in said molten synthetic resin by retracting said holding pin from said cavity to obtain an insert-molding product, wherein said insert product is covered with said synthetic resin, and sealingly closing said hole by extruding the synthetic resin from said space into said cavity such that said hole is filled with the synthetic resin:

wherein said space is under pressure of the surrounding synthetic resin.

10. The method according to claim 9 wherein the step of sealingly closing said hole by extruding the synthetic resin from said space into said cavity, extrudes a molten synthetic resin from said space into said cavity.

* * * * *